United States Patent
Bellorado et al.

(10) Patent No.: US 10,152,457 B1
(45) Date of Patent: Dec. 11, 2018

(54) TARGET PARAMETER ADAPTATION

(71) Applicant: Seagate Technology LLC, Cupertino, CA (US)

(72) Inventors: Jason Vincent Bellorado, San Jose, CA (US); Marcus Marrow, San Jose, CA (US); Zheng Wu, San Jose, CA (US)

(73) Assignee: Seagate Technology LLC, Cupertino, TX (US)

(*) Notice: Subject to any disclaimer, the term of this patent is extended or adjusted under 35 U.S.C. 154(b) by 46 days.

(21) Appl. No.: 15/334,167

(22) Filed: Oct. 25, 2016

(51) Int. Cl.
G06F 17/10 (2006.01)
G06F 17/17 (2006.01)
G06F 17/11 (2006.01)

(52) U.S. Cl.
CPC .............. G06F 17/17 (2013.01); G06F 17/11 (2013.01)

(58) Field of Classification Search
CPC .................................. G06F 17/17; G06F 17/11
USPC .................................................. 708/322–323
See application file for complete search history.

(56) References Cited

U.S. PATENT DOCUMENTS

| | | | |
|---|---|---|---|
| 5,563,746 A | 10/1996 | Bliss | |
| 5,726,818 A | 3/1998 | Reed et al. | |
| 5,754,352 A | 5/1998 | Behrens et al. | |
| 5,793,548 A | 8/1998 | Zook | |
| 5,822,142 A | 10/1998 | Hicken | |
| 5,909,332 A | 6/1999 | Spurbeck et al. | |
| 5,954,837 A | 9/1999 | Kim | |
| 6,069,758 A | 5/2000 | Chung | |
| 6,172,836 B1 | 1/2001 | Bang | |
| 6,275,346 B1 | 8/2001 | Kim et al. | |
| 6,307,696 B1 | 10/2001 | Bishop et al. | |
| 6,330,293 B1 | 12/2001 | Klank et al. | |
| 6,353,649 B1 | 3/2002 | Bockleman et al. | |
| 6,480,349 B1 | 11/2002 | Kim et al. | |
| 6,594,094 B2 | 7/2003 | Rae | |
| 6,594,098 B1 | 7/2003 | Sutardja | |
| 6,760,185 B1 | 7/2004 | Roth et al. | |
| 6,973,150 B1 | 12/2005 | Thuringer | |
| 6,996,193 B2 | 2/2006 | Yamagata et al. | |
| 7,035,029 B2 | 4/2006 | Sawada et al. | |
| 7,068,461 B1 | 6/2006 | Chue et al. | |
| 7,075,967 B2 | 7/2006 | Struhsaker et al. | |
| 7,199,956 B1 | 4/2007 | Moser et al. | |
| 7,297,582 B2 | 11/2007 | Asakura et al. | |
| 7,602,568 B1 | 10/2009 | Katchmart | |
| 7,643,548 B2 | 1/2010 | Hafeez | |
| 7,665,007 B2 | 2/2010 | Yang et al. | |
| 7,738,538 B1 | 6/2010 | Tung | |
| 7,917,563 B1 | 3/2011 | Shih et al. | |
| 7,995,691 B2 | 8/2011 | Yang | |
| 8,019,026 B2 | 9/2011 | Maltsev et al. | |

(Continued)

Primary Examiner — Tan V. Mai
(74) Attorney, Agent, or Firm — Cesari & Reed, LLP; Kirk A. Cesari; Logan Brown

(57) ABSTRACT

An apparatus may include a circuit including a filter configured to update one or more adaptive coefficients of the filter based on an error signal. Further, the circuit may update a constrained coefficient of the filter based on the one or more adaptive coefficients, the constrained coefficient and a desired value. Moreover, the circuit may generate a sample of a sample sequence based on the one or more adaptive coefficients and the updated constrained coefficient, the error signal being based on the sample sequence.

20 Claims, 4 Drawing Sheets

(56) References Cited

U.S. PATENT DOCUMENTS

| | | |
|---|---|---|
| 8,077,571 B1 | 12/2011 | Xia et al. |
| 8,121,229 B2 | 2/2012 | Kuo et al. |
| 8,139,305 B2 | 3/2012 | Mathew et al. |
| 8,159,768 B1 | 4/2012 | Miyamura |
| 8,266,505 B2 | 9/2012 | Liu et al. |
| 8,331,050 B1 | 12/2012 | Zou |
| 8,400,726 B1 | 3/2013 | Zheng |
| 8,405,924 B2 | 3/2013 | Annampedu |
| 8,516,347 B1 | 8/2013 | Li et al. |
| 8,553,730 B2 | 10/2013 | Schmidl et al. |
| 8,593,750 B2 | 11/2013 | Shibano |
| 8,625,216 B2 | 1/2014 | Zhang et al. |
| 8,681,444 B2 | 3/2014 | Zhang |
| 8,706,051 B2 | 4/2014 | Park et al. |
| 8,774,318 B2 | 7/2014 | Lakkis |
| 9,043,688 B1 | 5/2015 | Chan et al. |
| 9,078,204 B2 | 7/2015 | Okazaki |
| 9,129,646 B2 | 9/2015 | Mathew et al. |
| 9,236,952 B2 | 1/2016 | Sun |
| 9,362,933 B1 | 6/2016 | Chaichanavong |
| 9,425,950 B2 | 8/2016 | Kou |
| 9,537,589 B2 | 1/2017 | Kim et al. |
| 9,613,652 B2 | 4/2017 | Link et al. |
| 2002/0094048 A1 | 7/2002 | Simmons et al. |
| 2003/0026016 A1 | 2/2003 | Heydari et al. |
| 2003/0048562 A1 | 3/2003 | Heydari et al. |
| 2003/0185291 A1 | 10/2003 | Nakahira et al. |
| 2004/0047403 A1* | 3/2004 | Choi .............. H04B 1/71055 375/148 |
| 2007/0002890 A1 | 1/2007 | Mangold et al. |
| 2007/0018733 A1 | 1/2007 | Wang |
| 2008/0292029 A1 | 11/2008 | Koslov |
| 2009/0268857 A1 | 10/2009 | Chen |
| 2010/0138722 A1 | 6/2010 | Harley |
| 2010/0211830 A1 | 8/2010 | Sankaranarayanan et al. |
| 2010/0272150 A1 | 10/2010 | Kil et al. |
| 2011/0072330 A1 | 3/2011 | Kolze |
| 2011/0158359 A1 | 6/2011 | Khayrallah et al. |
| 2013/0182347 A1 | 7/2013 | Maeto |
| 2013/0339827 A1 | 12/2013 | Han et al. |
| 2014/0337676 A1 | 11/2014 | Yen et al. |
| 2014/0355147 A1 | 12/2014 | Cideciyan et al. |
| 2015/0124912 A1 | 5/2015 | Eliaz et al. |
| 2015/0179213 A1 | 6/2015 | Liao et al. |
| 2015/0189574 A1 | 7/2015 | Ng et al. |
| 2016/0055882 A1 | 2/2016 | Cideciyan et al. |
| 2016/0134449 A1 | 5/2016 | Liu et al. |
| 2016/0156493 A1 | 6/2016 | Bae et al. |
| 2016/0270058 A1 | 9/2016 | Furuskog et al. |
| 2016/0293205 A1 | 10/2016 | Jury et al. |
| 2017/0162224 A1 | 6/2017 | Mathew et al. |

* cited by examiner

TARGET PARAMETER ADAPTATION

SUMMARY

In certain embodiments, an apparatus may include a circuit including a filter configured to update one or more adaptive coefficients of the filter based on an error signal. Further, the circuit may update a constrained coefficient of the filter based on the one or more adaptive coefficients, the constrained coefficient and a desired value. Moreover, the circuit may generate a sample of a sample sequence based on the one or more adaptive coefficients and the updated constrained coefficient, the error signal being based on the sample sequence.

In certain embodiments, a system may comprise a filter circuit configured to update one or more adaptive coefficients of the filter based on an error signal. The filter circuit may also update a constrained coefficient of the filter based on the one or more adaptive coefficients, the constrained coefficient and a desired value. Moreover, the filter circuit may generate a sample of a sample sequence based on the one or more adaptive coefficients and the updated constrained coefficient, the error signal being based on the sample sequence.

In certain embodiments, a method may include updating one or more adaptive parameters of a filter based on an error signal. The method may further include updating a constrained parameter of the filter based on the one or more adaptive parameters, the constrained parameter and a desired value. In addition, the method may include generating a sample of a sample sequence based on the one or more adaptive parameters and the updated constrained parameter, the error signal being based on the sample sequence.

DETAILED DESCRIPTION

Figure 1:
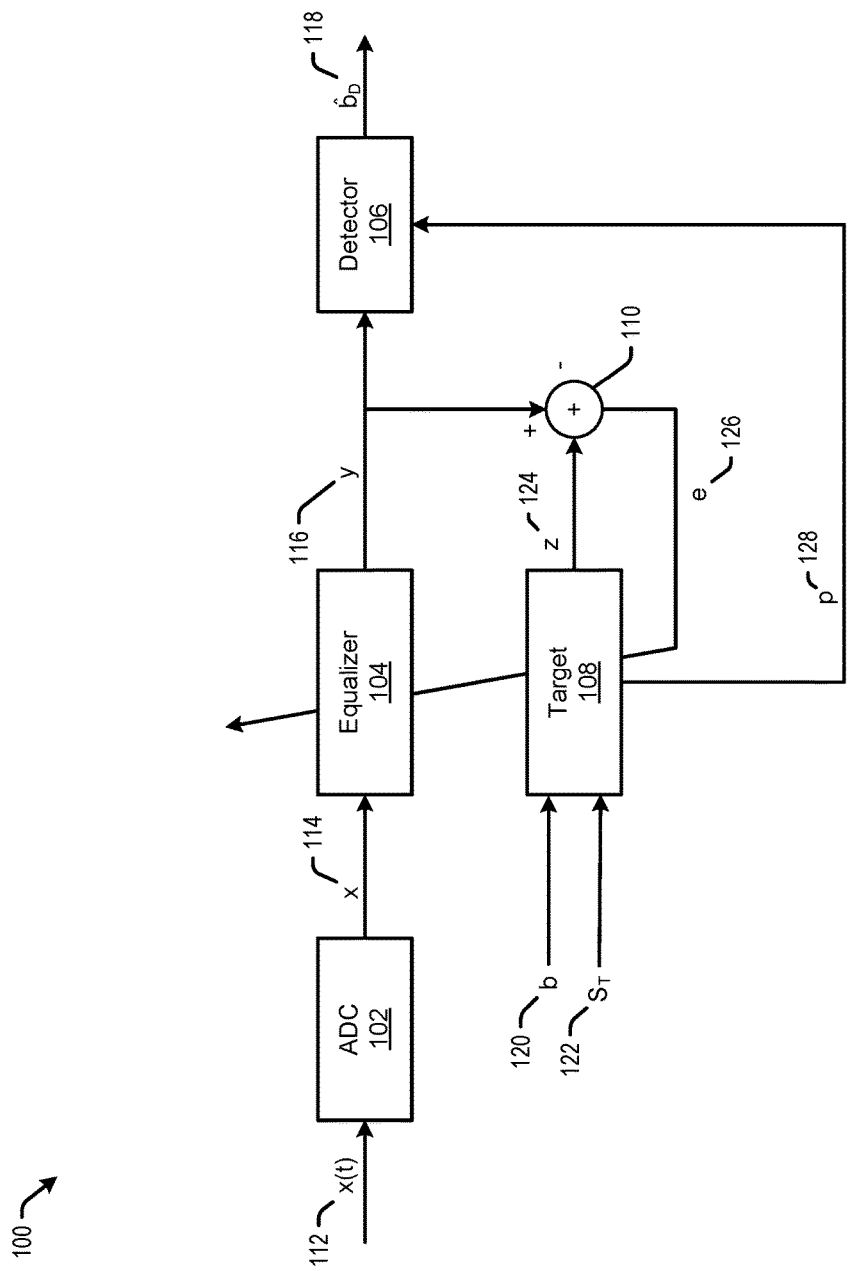
FIG. 1 is a block diagram of a system of target parameter adaptation, in accordance with certain embodiments of the present disclosure.

In the following detailed description of the embodiments, reference is made to the accompanying drawings which form a part hereof, and in which are shown by way of illustrations. It is to be understood that features of the various described embodiments may be combined, other embodiments may be utilized, and structural changes may be made without departing from the scope of the present disclosure. It is also to be understood that features of the various embodiments and examples herein can be combined, exchanged, or removed without departing from the scope of the present disclosure.

In accordance with various embodiments, the methods and functions described herein may be implemented as one or more software programs running on a computer processor or controller. In accordance with another embodiment, the methods and functions described herein may be implemented as one or more software programs running on a computing device, such as a personal computer that is using a disc drive. Dedicated hardware implementations including, but not limited to, application specific integrated circuits, programmable logic arrays, and other hardware devices can likewise be constructed to implement the methods and functions described herein. Further, the methods described herein may be implemented as a computer readable storage medium or device including instructions that when executed cause a processor to perform the methods.

The present disclosure generally relates to parameter adaptation, and in some embodiments, the present disclosure relates to target parameter adaptation. Some systems, such as electrical, electronic, motor drive, processing, or other systems may receive a signal of interest and process that signal based on parameters.

For example, a read channel of a communication system or a magnetic recording storage system may utilize adaptive parameters to process an input signal. In some systems, a detector may generate a data sequence based on an equalized sample sequence and a target sequence. In such systems, the equalized sample sequence may be generated by an equalizer and the target sample sequence may be generated by a target module. In some cases, the equalizer and target module may operate based on adaptive parameters. For example, the equalizer and target module may be filter circuits, such as finite impulse response filters, and the adaptive parameters may be coefficients or taps of the filter circuits.

In some embodiments, a set of adaptive parameters of a filter may be adapted based on an error signal (e.g. a difference between a target sequence sample and an equalized sequence sample). One or more additional parameters, herein referred to as constraint parameters, may be adapted based on other criteria. For example, the one or more constraint parameters may be adapted based on the values of the other adaptive parameters. An example of such a system is discussed below with regard to FIG. 1.

While the discussion herein utilizes parameters of a target module of a read channel as examples, the disclosed techniques and systems may apply to other circuits or parameters. Many variations would be apparent to one of ordinary skill in the art in view of this disclosure. For example, while the following discussion is provided in the context of a system including one constraint parameter, implementations are not so limited.

Referring to FIG. 1, a block diagram of a system of target parameter adaptation is shown and is generally designated 100. System 100 can include an analog-to-digital converter (ADC) 102 that may be coupled to an equalizer 104. The equalizer 104 may be coupled to a detector 106 and an adder 110. The adder 110 may be coupled to a target 108. In turn, the target 108 may be coupled to the adder 104 and the detector 106. As discussed in detail below, in the embodiment illustrated in FIG. 1, the parameters that are adapted are the parameters of the equalizer 102 and the target 108.

Each of the ADC 102, equalizer 104, detector 106, target 108, and adder 110 may be a separate circuit, a system on chip (SOC), firmware, a processor(s), or other system not listed, or any combination thereof.

In operation, the ADC 102 may sample a continuous-time signal x(t) 112 at regular intervals and may quantize the signal to produce a digitized sequence of samples x 114.

The equalizer 102 may receive the digitized sequence of samples x 114 and generate an equalized sample sequence y 116. In some examples, the equalizer may operate to shorten the intersymbol interference (ISI) length, or memory, of a channel. This may allow the use of a less complex detector. Further, the equalizer 102 may act to absorb variations in the input signal or noise statistics that may occur over time. In general, the equalizer 102 may produce a consistent, known, input signal to the detector 106 such that the detector 106 may estimate the data sequence corresponding to the signal x(t) 112.

The target 108 may receive a signal b 120 which may be used to generate a target sample sequence z 124. The signal b 120 may be based on or derived from the signal x(t) 112. For example, the signal b 120 may be the known (e.g. a training data pattern) or estimated values of the data sequence corresponding to the signal x(t) 112. More particularly, in some examples, the target sample sequence 124 may be generated as a convolution of the known or estimated values (e.g., in NRZ format) of the data sequence corresponding to the signal x(t) 112.

The detector 106 may operate to determine (or estimate) a data sequence $\hat{b}_D$ 118 of bit values corresponding to the signal x(t) 112 based on the equalized sample sequence y 116 and the target polynomial p 128 (e.g. the parameters or coefficients of the target 108). Specifically, the target polynomial p 128 is provided to the detector to be used for estimation of the data sequence $\hat{b}_D$ 118.

The adder 110 may receive the equalized sample sequence y 116 and the target sample sequence z 124. The adder 110 may combine the equalized sample sequence y 116 and the target sample sequence z 124 to generate an error signal e 126. The error signal e 126 may represent the difference between the equalizer output, equalized sample sequence y 116, and the target filter output, target sample sequence z 124.

The equalizer 104 may receive the error signal e 126 and update the parameters of the equalizer 104 based on the error signal e 126. Similarly, the target 108 may receive the error signal e 126 and update at least some of the adaptive parameters of the target 108 based on the error signal e 126. For example, in an embodiment where the equalizer 104 or target 108 may be finite impulse response (FIR) filters, the adaptive parameters may be tap coefficients of the FIR filters. As mentioned above, the target sample sequence z 124 may be generated as a convolution of the data sequence b 120 using the following equation:

$$z_k = \sum_{i=0}^{L-1} t_i \times b_{k-i}.$$

where $t_i$ are the parameters or tap coefficients of the FIR filter of the target 108 and L is the number of taps.

In some examples, the parameters may be adapted using a minimum mean-square error (MMSE) criteria in which the equalizer parameters and target parameters may be selected to minimize the expected value of the square of the error sequence e 126. For example, this criteria may be implemented using an adaptive implementation known as least mean square or LMS. Using such an example implementation, gradients may be computed and used to update the coefficients.

For some adaptive procedures, the parameters of the equalizer 104 and target 108 may be updated by computing, for each parameter, the parameter's gradient (∇) with respect to a chosen figure-of-merit (e.g. mean-squared error) and applying the gradient using a scale (step-size) as:

$$w_k^{(t)} = (w_k^{(t-1)} - \eta_w \cdot \nabla_{w_k})$$

$$t_j^{(t)} = (t_j^{(t-1)} - \eta_t \cdot \nabla_{t_j}).$$

As shown, each tap of the equalizer and target filters at time (t−1) ($w_k^{(t-1)}, t_j^{(t-1)}$) may be modified by subtracting off its respective gradient, scaled by its respective step-size ($\eta_w, \eta_t$), to produce an updated set of coefficients ($w_k^{(t)}, t_j^{(t)}$).

However, implementations are not limited to using LMS and may instead include a variety of other adaptive algorithms, such as 'zero-forcing' equalization, that may adapt parameters to 'other' optimality criteria.

As mentioned above, in some embodiments, other adaptive parameters or coefficients of the target 108, referred to herein as constraint parameters, may be adapted based on another criteria.

In some embodiments in which both the equalizer and target may be jointly optimized, a constraint may be imposed that may avoid a degenerate solution in which all taps may converge to zero. Although the resulting mean-squared error is zero in this case, such a solution may not achieve a low detector error-rate.

In some embodiments according to this disclosure, another example criterion may be to select a constraint parameter to provide a desired signal dynamic range in the target sample sequence 126 and, by extension, the equalized sample sequence 116. For example, the target sample sequence output obtained utilizing a constraint parameter of one (1) may be scaled by 0.5 relative to the case in which the constraint parameter is set to two (2). In a hardware implementation in which the precision used along the data-path (e.g. from the equalizer 104 to detector 106) may be limited (e.g. 32 values for a 6-bit data path), the selection of the constraint parameter may effectively trade off quantization and saturation (e.g. in the target sample sequence). If the constraint is set too small, a smaller fraction of the target output range may be utilized, which may lead to excessive signal quantization. If the constraint parameter is set too large, excessive sample saturation may occur (e.g. saturated samples may be samples larger than the largest value representable by the data path). In both cases, the performance may suffer compared to a desirably utilized signal range. In addition, in some examples, since the equalized sample sequence y 116 may be driven to match the target sample sequence 126, the equalized sample sequence y 116 may experience the same or similar quantization and/or saturation.

To improve the performance, an adaptive constraint system may be implemented. In some embodiments, the constraint parameter may be adapted in such a way so as to provide a desired signal dynamic range. In some examples, the target 108 may take as input a desired value $S_T$ 122 and set the constraint parameter such that this condition is achieved. As mentioned above, the $k^{th}$ sample of the target sample sequence z may be generated as a convolution of the data sequence b 120 using the following equation:

$$z_k = \sum_{i=0}^{L-1} t_i \times b_{k-i}.$$

where L is the number of taps, $t_i$ are the parameters or tap coefficients of the FIR of the target 108 and b{−1, +1}. In such an embodiment, the maximum target sample sequence value for a set of target parameters may be expressed as, $$\max(|z|) = \sum_{i=0}^{L-1} |t_i|$$

which may be achieved for the data sequence 120 in which $\text{sign}(b_{k-i}) = \text{sign}(t_i)$. This corresponds to the largest expected (noiseless) output of the equalizer.

In some embodiments, the desired value $S_T$ 122 may be or be related to the desired maximum target sample sequence value and may affect the equalized sample sequence y 116 as sequence 116 may be driven to match the target sample sequence 126 and, by extension, the desired value $S_T$ 122. For example, where the data path has a 6-bit width and represents values between −32 and 31, a desired value 122 of twenty-eight (e.g. $S_T = 28$) may indicate that the desired $\max(|z|)$ is 28. The constraint parameter (such as using tap $T_0$ as a representative example) may be adapted using a gradient that is computed as a difference of the current value of $\max(|z|)$ and the desired value $S_T$ as, $$\nabla_{T_0} = \text{sgn}(\max(|z|)) - S_T$$

The constraint parameter $T_0$ used as a representative example will be referenced for ease of discussion. This is not intended to limit the constraint parameter to any particular tap or parameter and embodiments according to this disclosure may utilize any tap or parameter as a constraint parameter.

In some implementations, the computed gradient may be +1 or −1 if the maximum target sample sequence value exceeds or is smaller than the desired value $S_T$, respectively. Since the gradient is scaled and subtracted from the current coefficient value, the associated update may act to adapt $T_0$ in such a manner as to reduce the deviation of $\max(|z|)$ from $S_T$.

Figure 2:
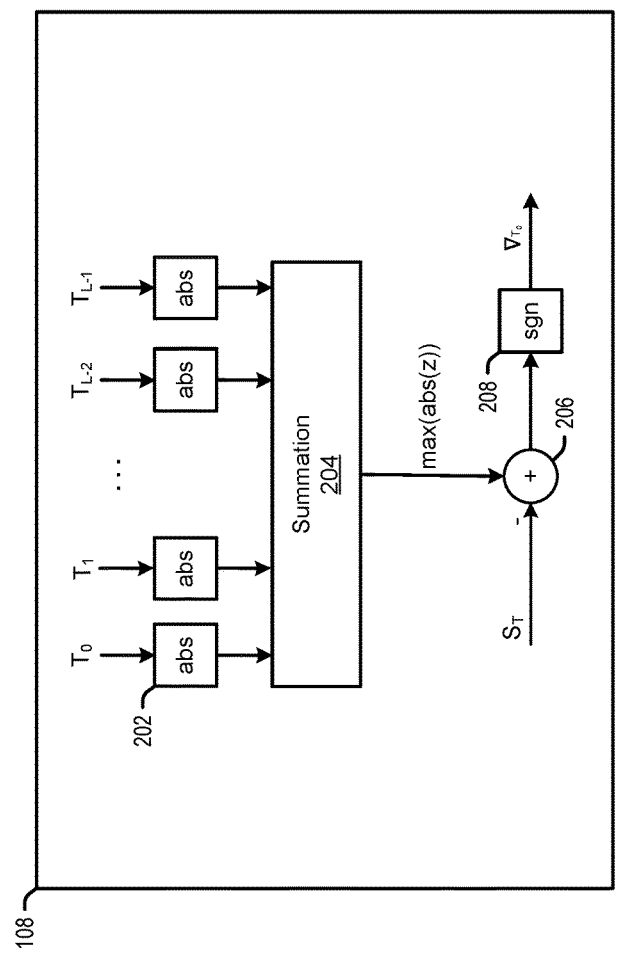
FIG. 2 is a block diagram of a system of target parameter adaptation, in accordance with certain embodiments of the present disclosure.

Referring to FIG. 2, a block diagram of a portion of the architecture of the target 108 is shown and is generally designated 200. More particularly, the portion of the architecture of the target 108 shown may operate to determine the gradient $\nabla_{T_0}$.

As illustrated, the target 108 may include a series of absolute value circuits 202, a summation 204, an adder 206 and a sign function circuit 208 that may collectively operate to determine of the gradient $\nabla_{T_0}$ for the constraint parameter $T_0$:

$$\nabla_{T_0} = \text{sgn}\left(\sum_{i=0}^{L-1} |T_i| - S_T\right)$$

where L may be the number of taps, $T_i$ may be the parameters of the target 108 and $S_T$ may be the desired value 122.

Figure 3:
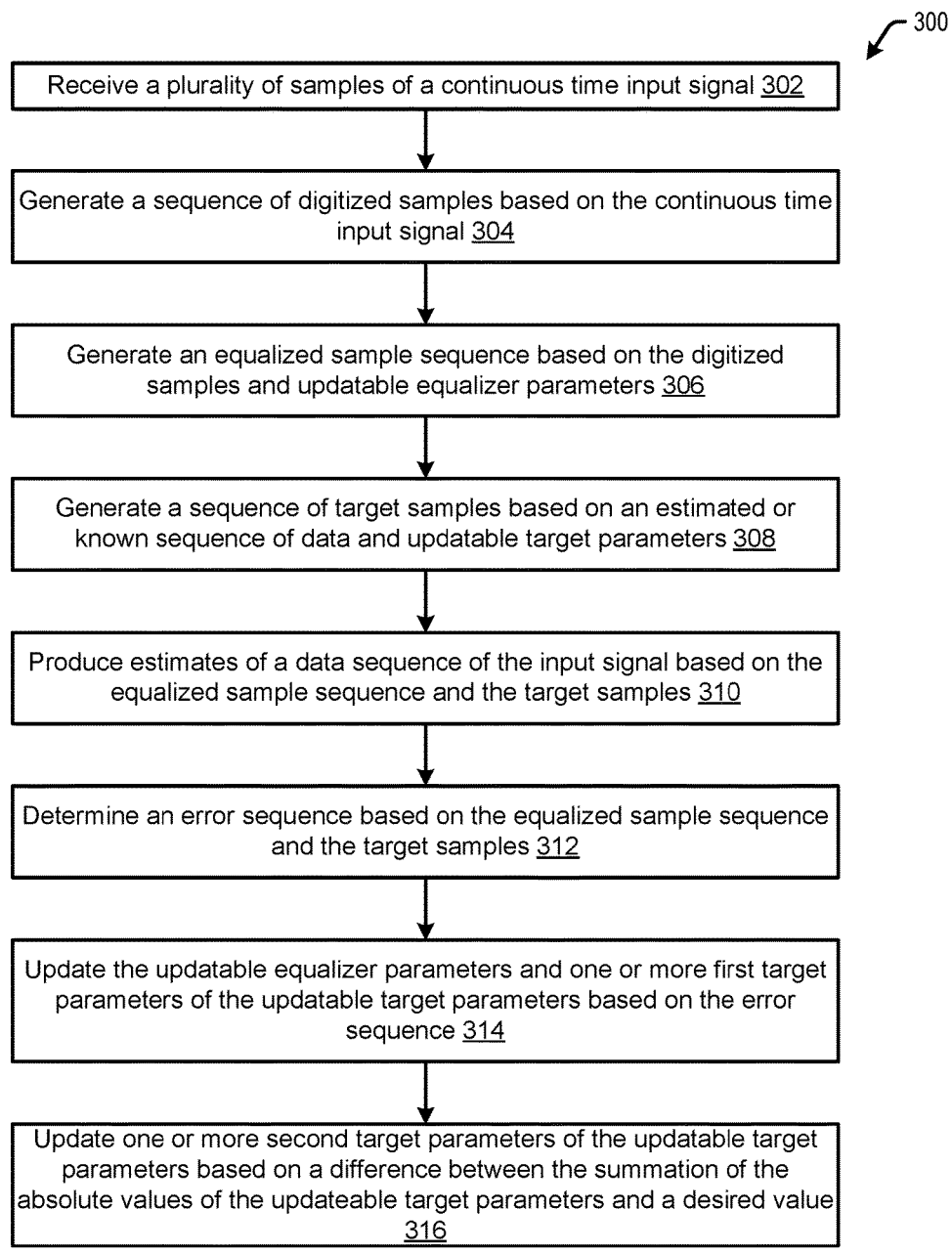
FIG. 3 is a flowchart of a method of target parameter adaptation, in accordance with certain embodiments of the present disclosure.

Referring to FIG. 3, a flowchart of a method including target parameter adaptation is shown and is generally designated 300. The method 300 can be an embodiment of the systems 100 and 200 and the operations of method 300 may be performed as detailed above with respect to FIGS. 1 and 2.

The system may receive a plurality of samples of a continuous time input signal at 302. The system may then generate a sequence of digitized samples based on the continuous time input signal at 304. At 306, the system may generate an equalized sample sequence based on the digitized samples and updatable equalizer parameters. Next, the system may generate a sequence of target samples based on an estimated or known sequence of data and updatable target parameters at 308. At 310, the system may produce estimates of a data sequence of the input signal based on the equalized sample sequence and the target samples. The system may determine an error sequence based on the equalized sample sequence and the target samples. Next, the system may update the updatable equalizer parameters and one or more first target parameters of the updatable target parameters based on the error sequence at 314. The system may then update one or more second target parameters of the updatable target parameters based on a difference between the summation of the absolute values of the updatable target parameters and a desired value.

All steps listed for the method 300 may be applied to systems that have adaptive parameters. For example, the systems and methods described herein may be applied to the equalizer parameters (e.g. the equalizer coefficient). More particularly, a similar value may be computed (e.g., a sum of the absolute values of the target parameters or tap coefficient) and a similar adaptation or gradient may be applied to a constraint equalizer parameter to increase or decrease the gain through the equalizer. Many variations would be apparent in view of this disclosure. Components and circuits used to perform the operations in the method may be discrete, integrated into a system on chip (SOC), or other circuits. Further, the steps can be carried out in a processor (e.g. a digital signal processor), implemented in software, implemented via firmware, or by other means.

Figure 4:
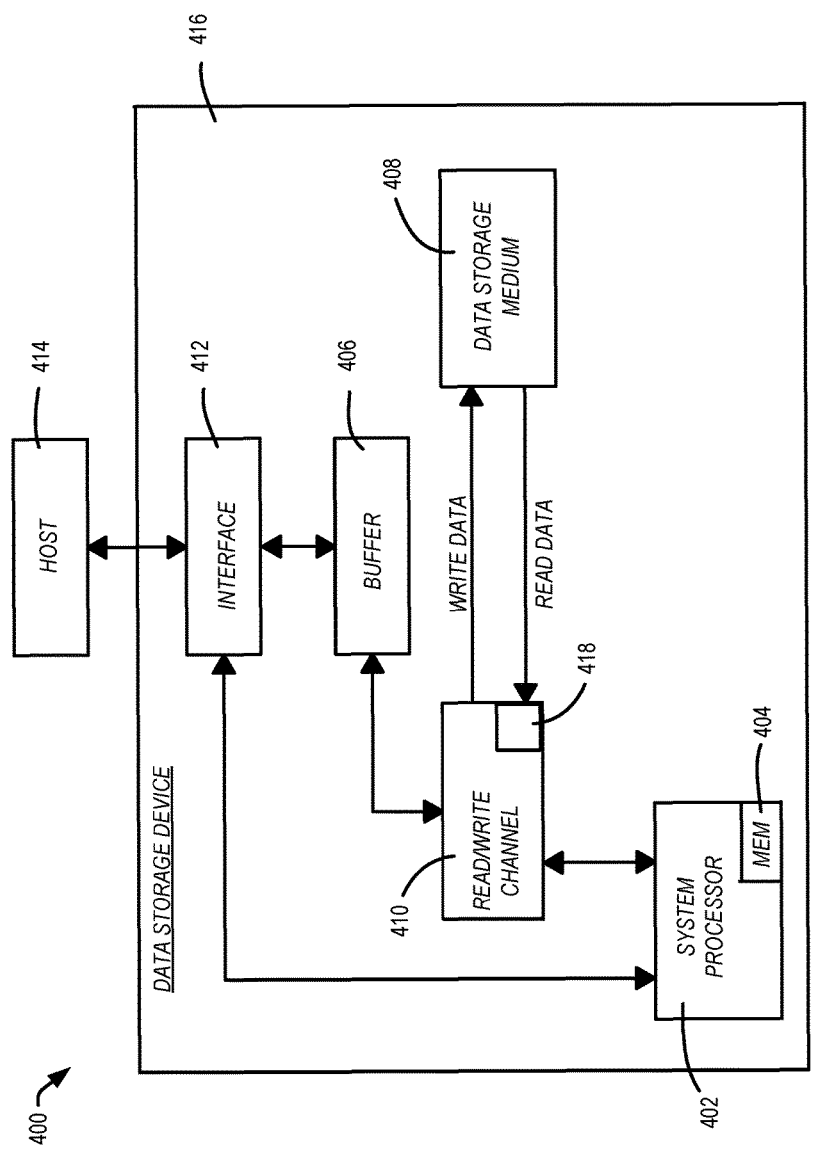
FIG. 4 is a block diagram of a system including target parameter adaptation, in accordance with certain embodiments of the present disclosure.

Referring to FIG. 4, a block diagram of a system including target parameter adaptation is shown and generally designated 400. The system 400 can be an example of a data storage device (DSD), and may be an example implementation of systems 100, 200, 300 or 400. The DSD 416 can optionally connect to and be removable from a host device 414, which can be a device or system having stored data, such as a desktop computer, a laptop computer, a server, a digital video recorder, a photocopier, a telephone, a music player, other electronic devices or systems not listed, or any combination thereof. The data storage device 416 can communicate with the host device 414 via the hardware/firmware based host interface circuit 412 that may include a connector (not shown) that allows the DSD 416 to be physically connected and disconnected from the host 414.

The DSD 416 can include a system processor 402, which may be a programmable controller, and associated memory 404. The system processor 402 may be part of a system on chip (SOC). A buffer 406 may temporarily store data during read and write operations and can include a command queue. The read/write (R/W) channel 410 can encode data during write operations to, and reconstruct data during read operations from, the data storage medium 408. The data storage medium 408 is shown and described as a hard disc drive, but may be other types of magnetic medium, such as a flash medium, optical medium, or other medium, or any combination thereof.

The R/W channel 410 may receive data from more than one data storage medium at a time, and in some embodiments can also receive multiple data signals concurrently, such as from more than one output of a read head. For example, storage systems having two-dimensional magnetic recording (TDMR) systems can have multiple reading or recording elements, and can read from two tracks simultaneously or nearly simultaneously. Multi-dimensional recording (MDR) systems can receive two or more inputs from multiple sources (e.g. recording heads, flash memory, optical memory, and so forth). The R/W channel 410 can combine multiple inputs and provide a single output, as described in examples herein.

The block 418 can implement all of or part of the systems and functionality of systems and methods 100, 200, and 300. In some embodiments, the block 418 may be a separate circuit, integrated into the R/W channel 410, included in a system on chip, firmware, software, or any combination thereof.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, the figures and above description provide examples of architecture and voltages that may be varied, such as for design requirements of a system. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above examples, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
    a circuit including a filter configured to:
        update one or more adaptive coefficients of the filter based on an error signal;
        update a constrained coefficient of the filter based on the one or more adaptive coefficients, the constrained coefficient and a desired value, the update of the one or more adaptive coefficients of the filter not based on the desired value; and
        generate a sample of a sample sequence based on the one or more adaptive coefficients and the updated constrained coefficient, the error signal being based on the sample sequence.

2. The apparatus of claim 1, further comprising the circuit further configured to:
    generate an equalized sample sequence by equalizing a plurality of samples of a digitized sample sequence based on one or more equalizer parameters, the equalized sample sequence including a plurality of equalized samples.

3. The apparatus of claim 2, further comprising the circuit further configured to:
    generate an output signal based on the equalized sample sequence, the one or more adaptive coefficients and the updated constrained coefficient; and
    perform generation of the sample of the sample sequence based on one of a known value corresponding to the output signal and an estimated value corresponding to the output signal.

4. The apparatus of claim 2, further comprising the circuit further configured to:
    generate the error signal based on a difference between the equalized sample sequence and the sample sequence.

5. The apparatus of claim 1, further comprising the circuit further configured to:
    perform an update of another constrained coefficient of an equalizer of a read channel based on a difference between:
        a summation of absolute values of values of the one or more adaptive coefficients and the constrained coefficient; and
        the desired value.

6. The apparatus of claim 1 further comprising the circuit further configured to:
    perform the update of the constrained coefficient based on the one or more adaptive coefficients, the constrained coefficient and the desired value based on a difference between:
        a summation of absolute values of the values of the one or more adaptive coefficients and the constrained coefficient; and
        the desired value.

7. The apparatus of claim 1, further comprising the one or more adaptive coefficients and the constrained coefficient being coefficients of a target polynomial of a finite impulse response filter.

8. The apparatus of claim 1, further comprising the circuit configured to perform the update of the adaptive coefficients using a minimum mean square error criteria.

9. The apparatus of claim 1, further comprising the circuit configured to perform the update of the constrained coefficient using gradient descent.

10. A system comprising:
    a filter circuit configured to:
        update one or more adaptive coefficients of the filter circuit based on an error signal using a first update algorithm;
        update a constrained coefficient of the filter based on the one or more adaptive coefficients, the constrained coefficient and a desired value using a second update algorithm different from the first update algorithm; and
        generate a sample of a sample sequence based on the one or more adaptive coefficients and the updated constrained coefficient, the error signal being based on the sample sequence.

11. The system of claim 10 further comprising:
    an equalizer circuit configured to generate an equalized sample sequence by equalizing a plurality of samples of a digitized sample sequence based on one or more equalizer parameters, the equalized sample sequence including a plurality of equalized samples.

12. The system of claim 11 further comprising:
    a detector circuit configured to generate an output signal based on the equalized sample sequence and the one or more adaptive coefficients and the updated constrained coefficient; and
    the filter circuit configured to perform generation of the sample of the sample sequence based on one of a known value corresponding to the output signal and an estimated value corresponding to the output signal.

13. The system of claim 11 further comprising:
    an adder circuit configured to generate the error signal based on a difference between the equalized sample sequence and the sample sequence.

14. The system of claim 11 further comprising the circuit further configured to:

perform an update of another constrained coefficient of an equalizer of a read channel based on a difference between:
  a summation of absolute values of the values of the one or more adaptive coefficients and the constrained coefficient; and
  the desired value.

15. The system of claim 10 further comprising the circuit configured to perform the update of the constrained coefficient based on the one or more adaptive coefficients, the constrained coefficient and the desired value based on a difference between:
  a summation of absolute values of the values of the one or more adaptive coefficients and the constrained coefficient; and
  the desired value.

16. The system of claim 10 further comprising the one or more adaptive coefficients and the constrained coefficient being coefficients of a target polynomial of a finite impulse response filter.

17. A method comprising:
  updating one or more adaptive parameters of a filter based on an error signal using a first update criteria;
  updating a constrained parameter of the filter based on the one or more adaptive parameters, the constrained parameter and a desired value using a second update criteria different from the first update criteria; and
  generating a sample of a sample sequence based on the one or more adaptive parameters and the updated constrained parameter, the error signal being based on the sample sequence.

18. The method of claim 17 further comprising:
  generating an equalized sample sequence by equalizing a plurality of samples of a digitized sample sequence based on one or more equalizer parameters, the equalized sample sequence including a plurality of equalized samples;
  generating an output signal based on the equalized sample sequence, the one or more adaptive parameters and the updated constrained parameter; and
  generating the error signal based on a difference between the equalized sample sequence and the sample sequence.

19. The method of claim 18 further comprising:
  performing the updating of the constrained parameter based on the one or more adaptive parameters, the constrained parameter and the desired value based on a difference between:
    a summation of absolute values of the values of the one or more adaptive parameters and the constrained parameter; and
    the desired value.

20. The method of claim 17 further comprising the one or more adaptive parameters and the constrained parameter being coefficients of a target polynomial of a finite impulse response filter.

* * * * *